(12) United States Patent
Mardi (10) Patent No.: US 10,520,544 B2
(45) Date of Patent: Dec. 31, 2019

(54) VERSATILE TESTING SYSTEM

(71) Applicant: Xilinx, Inc., San Jose, CA (US)

(72) Inventor: Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 275 days.

(21) Appl. No.: 15/250,390

(22) Filed: Aug. 29, 2016

(65) Prior Publication Data

US 2018/0059174 A1   Mar. 1, 2018

(51) Int. Cl.
  *G01R 31/28*   (2006.01)
  *G01R 31/26*   (2014.01)
  *G01R 31/02*   (2006.01)

(52) U.S. Cl.
  CPC ..... *G01R 31/2875* (2013.01); *G01R 31/2877* (2013.01); *G01R 31/2893* (2013.01)

(58) Field of Classification Search
  CPC ............ G01R 31/2875; G01R 31/2877; G01R 31/2893
  See application file for complete search history.

(56) References Cited

U.S. PATENT DOCUMENTS

| | | | | |
|---|---|---|---|---|
| 6,215,323 B1 * | 4/2001 | Rennies | ............ | G01R 31/2862 324/750.08 |
| 6,577,148 B1 * | 6/2003 | DeHaven | ............ | G01R 1/07314 324/762.05 |
| 2003/0117161 A1 * | 6/2003 | Burns | ............... | G01R 31/2851 324/750.02 |
| 2004/0239359 A1 * | 12/2004 | Matsumoto | ........ | G01R 31/2851 324/762.01 |
| 2013/0220579 A1 * | 8/2013 | Yosef | ....................... | F28F 3/12 165/104.21 |

* cited by examiner

*Primary Examiner* — Huy Q Phan
*Assistant Examiner* — Zannatul Ferdous
(74) *Attorney, Agent, or Firm* — Keith Toboada (57) ABSTRACT

A chip package assembly testing system and method for testing a chip package assembly are provided herein. In one example, an IC test system is provide that includes a robot, an input queuing station, an output queuing station, and a test station. The test station includes a first and second test interfaces. The first test interface is configurable to receive and communicatively connect with a first chip package assembly having one arrangement of solder ball connections. The second test interface is configurable to receive and communicatively connect with a second chip package assembly having a different arrangement of solder ball connections. The test station also includes a first test processor configured to test the chip package assembly connected through the first interface utilizing a predetermined first test routine and a second test processor configured to test the chip package assembly connected through the second interface utilizing a predetermined second test routine.

19 Claims, 5 Drawing Sheets

VERSATILE TESTING SYSTEM

TECHNICAL FIELD

Embodiments of the present invention generally relate to an integrated circuit chip package assembly testing system having a first and second test stations configurable to simultaneously test different types of integrated circuit packages.

BACKGROUND

Electronic devices, such as tablets, computers, copiers, digital cameras, smart phones, control systems and automated teller machines, among others, often employ electronic components which leverage chip package assemblies for increased functionality and higher component density. Certain specialized chip package assemblies, such as those used for military and aerospace applications, are often manufactured in low quantity productions runs. As these specialized low volume chip package assemblies are tested on the same chip package assembly testing systems utilized to test high volume runs, testing becomes a factory capacity bottle neck since conventional testing systems can only test a single type of chip package assembly at one time. This bottle neck increases the overall cost to operate the factory, and thus, undesirably adds cost not only the specialized low volume chip package assembly, but also to other chip package assemblies produced in high volume.

Therefore, a need exists for an improved testing system suitable for simultaneously testing different types of integrated circuit packages in a production environment.

SUMMARY

A chip package assembly testing system and method for testing a chip package assembly are provided herein. In one example, an IC test system is provided that includes a robot, an input queuing station configured to receive a plurality of chip package assemblies for testing within the IC test system, an output queuing station configured to receive chip package assemblies of the plurality of chip package assemblies after testing within the IC test system, and a test station. The test station includes a first test interface and a second test interface. The first test interface is configurable to receive and communicatively connect with a first chip package assembly having one arrangement of solder ball connections. The second test interface is configurable to receive and communicatively connect with a second chip package assembly having a different arrangement of solder ball connections. The test station also includes a first test processor configured to test the chip package assembly connected through the first interface utilizing a predetermined first test routine and a second test processor configured to test the chip package assembly connected through the second interface utilizing a predetermined second test routine.

In another example, a method for testing a chip package assembly is provided. The method includes transferring a first chip package assembly for testing in first test interface of a test station of a chip package assembly testing system; testing the first chip package assembly a first predefined test routine at a first predefined temperature; transferring a second chip package assembly for testing in second test interface of the test station of the chip package assembly testing system, wherein the first and second chip package assemblies are different types; and testing the second chip package assembly using a second predefined test routine, wherein testing the first and second chip package assemblies occur simultaneously.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly testing system and method for testing chip package assemblies disclosed herein improve testing throughput by enabling simultaneously test different types of testing chip package assemblies. The chip package assembly testing system may also run different tests at both hot and cold temperatures, thereby allowing more efficient testing. Furthermore, the modularly of the chip package assembly testing system allows additional queuing or test stations to be added thereby enabling changing production demands to be met with limited additional capital expenditures or down time for system reconfiguration.

Exemplary chip package assemblies, ball grid array (BGA) packages for example, generally include at least one or more integrated circuit (IC) dice disposed on a package substrate. In some embodiments, an interposer may be utilized to provide improved interconnection between two or more dice, and/or the dice and the package substrate. The IC die may be a programmable logic device, such as field programmable gate arrays (FPGA), a memory device, an optical device, a MEMS device, a processor or other IC logic or memory structure. Optical devices include photo-detectors, lasers, optical sources, and the like. The functionality of the IC die is provided by solid state circuitry formed in the die. At the end of the chip package assembly fabrication process, the chip package assemblies are tested to ensure robust and predictable performance.

Figure 1:
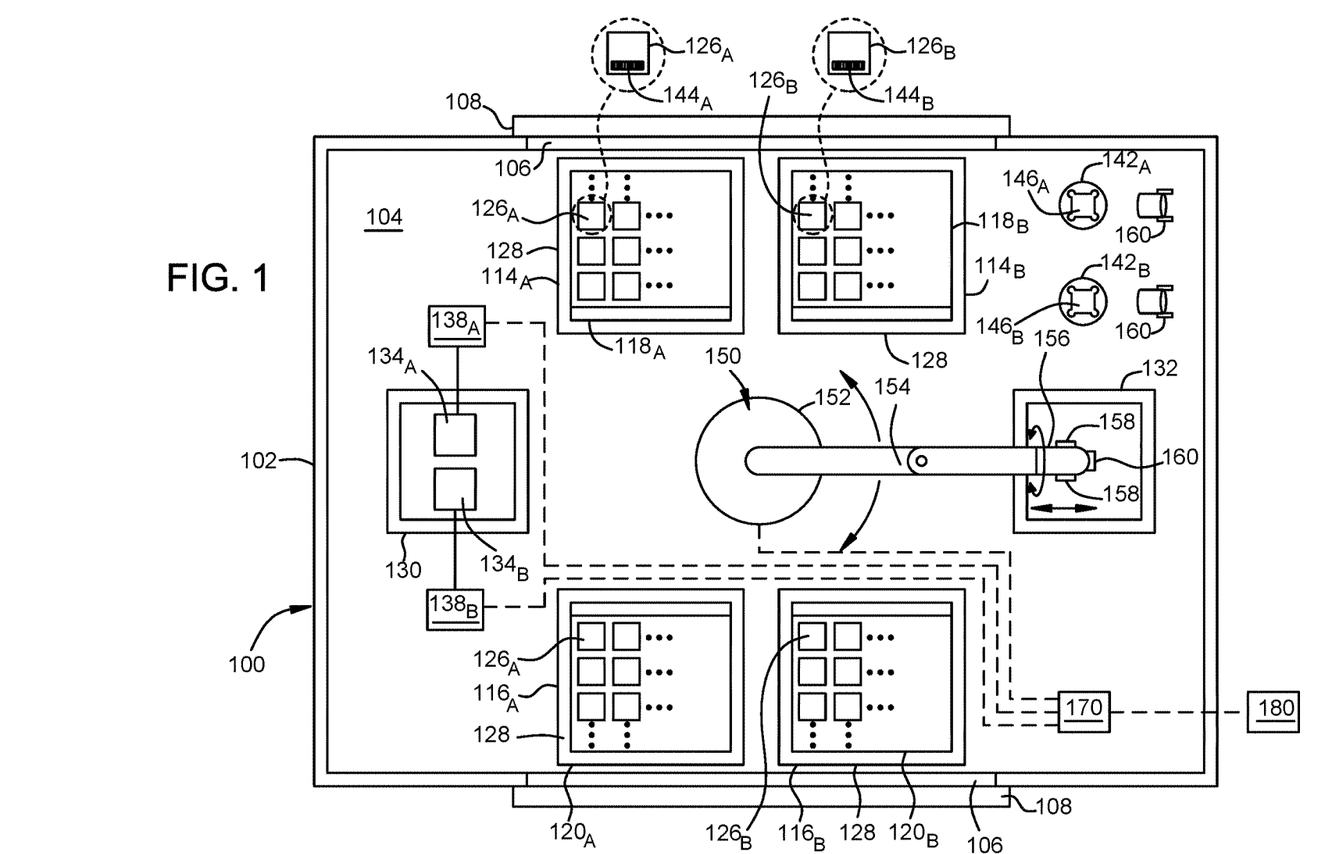
FIG. 1 is a schematic top view of a chip package assembly testing system.

FIG. 1 is a schematic top view of a chip package assembly testing system 100 suitable for simultaneous testing of chip package assemblies having different configurations. For example, the chip package assembly testing system 100 may be configured to simultaneous test both a first chip package assembly $126_A$ and a second chip package assembly $126_B$, wherein the first chip package assembly $126_A$ is different than the second chip package assembly $126_B$. The first chip package assembly $126_A$ and the second chip package assembly $126_B$ (also collectively referred to as the chip package assemblies 126) may be different in size, solder ball connection interface configuration, performance, construction or other attribute that will not allow the different chip package assemblies $126_A$, $126_B$ to be tested using the same interface with the same testing routine.

The modular chip package assembly testing system 100 generally includes an enclosure 102 having an interior region 104. At least one input queuing station 114, at least one output queuing station 116, at least one test station 130, a robot 150 and optional automatic identification and data capture (AIDC) device 160 are disposed in the interior region 104 of the enclosure 102. The robot 150 has a range of motion operable to transfer a chip package assembly 126 between any of the queuing and test stations of the testing system 100. In the embodiment illustrated in FIG. 1, the testing system 100 includes two input queuing stations $114_A$, $114_B$ (collectively input queuing stations 114), and two output queuing stations $116_A$, $116_B$ (collectively output queuing stations 116). The input queuing station $114_A$ is configured to accept and retain first chip package assemblies $126_A$ to be tested within the testing system 100 while the input queuing station $114_B$ is configured to accept and retain the second chip package assembly $126_B$ that are to be tested within the testing system 100. Similarly the output queuing station $116_A$ is configured to accept and retain the first chip package assembly $126_A$ that has been tested within the testing system 100 while the output queuing station $116_B$ is configured to accept and retain the second chip package assembly $126_B$ that has been tested within the testing system 100. Having at least two input queuing stations 114 and at least two output queuing stations 116 allows each type of chip package assembly $126_A$, $126_B$ to have a dedicated input and output queuing stations $114_{A/B}$, $116_{A/B}$, which simplifies routing of the chip package assemblies 126 within the testing system 100 and overall handling within the factory, both of which contribute to reducing the fabrication cost of the chip package assemblies 126.

The modular chip package assembly testing system 100 also includes a controller 170 that is utilized to control the operation of the chip package assembly testing system 100, including the operation of the robot 150 and handling information read by the AIDC device 160, when present. The controller 170 generally includes a central processing unit (CPU), memory, and support circuits utilized to control the operation of the chip package assembly testing system 100. The CPU may be any form of general purpose computer processor that may be used in an industrial setting. A software routine or a series of program instructions are stored in the memory, such as random access memory, read only memory, floppy, or hard disk drive, or other form of digital storage. The support circuit is conventionally coupled to the CPU and may include cache, clock circuits, input/output systems, power supplies, and the like.

In one example, the controller 170 is generally interfaced with the AIDC device 160 to track information uniquely related to each chip package assembly 126. For example, each chip package assembly 126 may include a machine readable identification (ID) tag associated with each chip package assembly 126. In one example, an identification tag $144_A$ is coupled to the chip package assembly $126_A$, for example, by printing, embossing, laser etching, labeling or bonding, among others. The identification tag $144_A$ coupled to the chip package assembly $126_A$ contains information that may be used least to identify the chip package assembly $126_A$ is a different type than the chip package assembly $126_B$ that has the identification tag $144_B$ coupled thereto.

The ID tags $144_A$, $144_B$ (collectively referred to as ID tags 144) may be a bar code, radio frequency (RF) transponder (i.e., RFID tag) or other machine readable tag. Accordingly, the AIDC device 160 must be of a type compatible for reading the type of machine readable information tag being utilized. In one example, the AIDC device 160 may be an RFID reader, a barcode reader, a camera or other suitable tag reading device.

The ID tag 144 may optionally be associated with a discreet file of information stored or accessible by the memory of the controller 170. The discreet file associated with the ID tag 144 may be inputted through a user interface of the controller 170, or communicated to the controller 170 from a remote host processing system 180. The information associated with the ID tag 144 may include at least the type of chip package assembly 126, and may optionally include one or more of, but is not limited to, a unique chip package assembly identification number, test results for the chip package assembly 126 (such as pass, fail or test data), defect information, and location of the chip package assembly 126 within the testing system 100, among other information.

In the example depicted in FIG. 1, a first input queuing station $114_A$ is configured to receive at least a first carrier $118_A$ containing a plurality of chip package assemblies $126_A$ for testing within the chip package assembly testing system 100. For example, the input queuing station $114_A$ may include a support surface 128 adapted to hold the first carrier $118_A$ in a position suitable for picking and placing (i.e., transfer) of the chip package assemblies $126_A$ from the first carrier $118_A$ by the robot 150.

Similarly depicted in FIG. 1, a second input queuing station $114_B$ is configured to receive at least a second carrier $118_B$ containing a plurality of chip package assemblies $126_B$ for testing within the chip package assembly testing system 100. For example, the second queuing station $114_B$ may include a support surface 128 adapted to hold the second carrier $118_B$ in a position suitable for picking and placing (i.e., transfer) of the chip package assemblies $126_B$ from the second carrier $118_B$ by the robot 150. As discussed above, the chip package assemblies $126_B$ are of a different type compared to the chip package assemblies $126_A$ and therefore cannot be tested using the same interface and testing routine.

The input queuing stations 114 are disposed immediately adjacent an access port 106 formed through the enclosure 102. The access port 106 is sized to allow passage of the first and second carriers $118_A$, $118_B$ therethrough. A cover 108 may be utilized to open and close the access port 106. With the access port 106 in an open state with the cover 108 removed, the carriers $118_A$, $118_B$ may be transferred into the enclosure 102 and placed on the support surface 128 of the appropriate input queuing stations 114. When the carriers $118_A$, $118_B$ are not being transferred through the access port 106 of the enclosure 102, the access port 106 may be closed by the cover 108 to help maintain the cleanliness of the interior region 104 of the chip package assembly testing system 100.

Similarly, the output queuing stations 116 are disposed immediately adjacent another access port 106 formed through the enclosure 102. The access port 106, as discussed above, is sized to allow passage of the first and second carriers $120_A$, $120_B$ therethrough. A cover 108 may be utilized to open and close the access port 106. With the access port 106 in an open state with the cover 108 removed, the carriers $120_A$, $120_B$ may be transferred into the enclosure 102 and placed on the support surface 128 of the appropriate input queuing stations 114. When the carriers $120_A$, $120_B$ are not being transferred through the access port 106 of the enclosure 102, the access port 106 may be closed by the cover 108 to help maintain the cleanliness of the interior region 104 of the chip package assembly testing system 100.

The controller 170 may manage the information associated with the ID tag 144. For example, information regarding test results (such as pass, fail or specific performance matrix such as power consumption, resistance, RC delay, temperature rise and the like) may be added to the file associated with a specific chip package assembly $126_A$ contained in the first carrier $118_A$ associated with the ID tag $144_A$.

The chip package assembly testing system 100 may also include at least two precisors $142_A$, $142_B$ (collective referred to as precisors 142). The precisor 142 aligns and/or conditions the solder bumps on the bottom of the chip package assembly 126 so that the chip package assembly 126 is not damaged when interfaced with the test stations of the testing system 100 or end use printed circuit board. Such precisors are conventionally known, such as described in U.S. Pat. No. 6,685,080, filed Oct. 20, 2000, and assigned to Micron Technologies, Inc., which is incorporated by reference in its entity.

The first precisor $142_A$ is configured to align and/or condition the solder bumps on the bottom of the chip package assembly $126_A$, while the second precisor $142_B$ is configured to align and/or condition the solder bumps on the bottom of the chip package assembly $126_B$. Having at least two precisors 142 advantageously enables the testing system 100 to simultaneously process and test chip package assemblies 126 having two different configurations of solder bumps.

In one example, the robot 150 transfers the chip package assemblies $126_A$ from the first queuing station $114_A$ to the first precisor $142_A$ for conditioning of the solder bumps prior to transferring the chip package assemblies $126_A$ to the test station 130 of the testing system 100. Similarly, the robot 150 may transfer the chip package assemblies $126_B$ from the second queuing station $114_B$ to the second precisor $142_B$ for conditioning of the solder bumps prior to transferring the chip package assemblies $126_B$ to the test station 130 of the testing system 100. Thus, the two differently configured precisors 142 allow the testing system 100 to simultaneously load and test different types of chip package assemblies 126 using a single test station 130.

In one example, the AIDC device 160 may be positioned proximate the precisors $142_{A/B}$ for identifying the chip package assembly 126 prior to placement in the precisor 142 to ensure the correct type of chip package assembly is loaded into the precisor 142 configured to accept that type chip package assembly. A single AIDC device 160 may be utilized with more than one precisor 142. However, having the same number of precisors 142 and AIDC devices 160, particularly where the AIDC device 160 is positioned immediately adjacent the precisors 142, allows faster throughput by reducing robot motion.

In another example, the AIDC device 160 may be in a location between the input queuing stations 114 and the test station 130 to allow the ID tag 144 disposed on each chip package assembly 126 to be read while the chip package assembly 126 is being transferred by the robot 150. In yet another example, the AIDC device 160 may be disposed on the robot 150 so that the ID tag 144 may be read at any location within the testing system 100 while the chip package assembly 126 is held by the robot 150.

As discussed above, at least a first test station 130 is disposed in the interior region 104 of the enclosure 102. In the example depicted in FIG. 1, a first test station 130 and a second test station 132 are shown. The second test station 132 may be configured identically to or different than the first test station 130. However, it is contemplated that any number of test stations may be utilized as long as there is room within the enclosure 102, and that the robot 150 may access all of the test stations.

The test station 130 includes two interfaces $134_A$, $134_B$, each configured to receive and communicatively connect with a different one of the chip package assemblies $126_{A/B}$ in a manner that enables testing to be performed on both the chip package assembly $126_A$ and chip package assembly $126_B$ in a single test station 130. The interfaces $134_A$, $134_B$ may each include one or more chip sockets, daughter boards, probers or other electrical interface suitable for establishing communication between the chip package assembly 126 and the testing circuitry of the test station 130. For example, the interface $134_A$ may be configured to accept the chip package assembly $126_A$ while the interface $134_B$ is configured to accept the chip package assembly $126_B$, thus enabling different types of chip package assemblies 126 to be tested simultaneously. Adding another test station 132 that is configured identical to the test station 130 allow greater throughput of both chip package assemblies $126_A$, $126_B$. Adding another test station 132 that is configured with only one of the interfaces, for example interface $134_A$, will allow greater throughput of the chip package assembly $126_A$ relative to the throughput of the chip package assembly $126_B$, advantageously permitting both a high volume run of the chip package assembly $126_A$ and a low volume run of the chip package assembly $126_B$ to be simultaneously tested using a single testing system 100.

The first interface $134_A$ of the test station 130 is coupled to a first test processor $138_A$. The first test processor $138_A$ generally includes a central processing unit (CPU), memory, and support circuits utilized to control the operation of the first test station 130. The CPU may be any form of general purpose computer processor that may be used in an industrial setting. A software routine or a series of program instructions are stored in the memory, such as random access memory, read only memory, floppy, or hard disk drive, or other form of digital storage. The support circuit is conventionally coupled to the CPU and may include cache, clock circuits, input/output systems, power supplies, and the like. The first test processor $138_A$ is coupled to the chip package assembly $126_A$ connected to the first interface $134_A$ of the first test station 130.

The second interface $134_B$ of the test station 130 is coupled to a second test processor $138_B$. The second test processor $138_B$ generally configured the same as the first test processor $138_A$. The second test processor $138_B$ is coupled to the chip package assembly $126_B$ connected to the second interface $134_B$ of the first test station 130.

The separate test processors $138_A$, $138_B$ facilitate simultaneously running different test routines on different types of chip package assemblies. It is also contemplated the functions of the separate test processors $138_A$, $138_B$ may be run by a single processor, local or remote from the test station 130.

Figure 2:
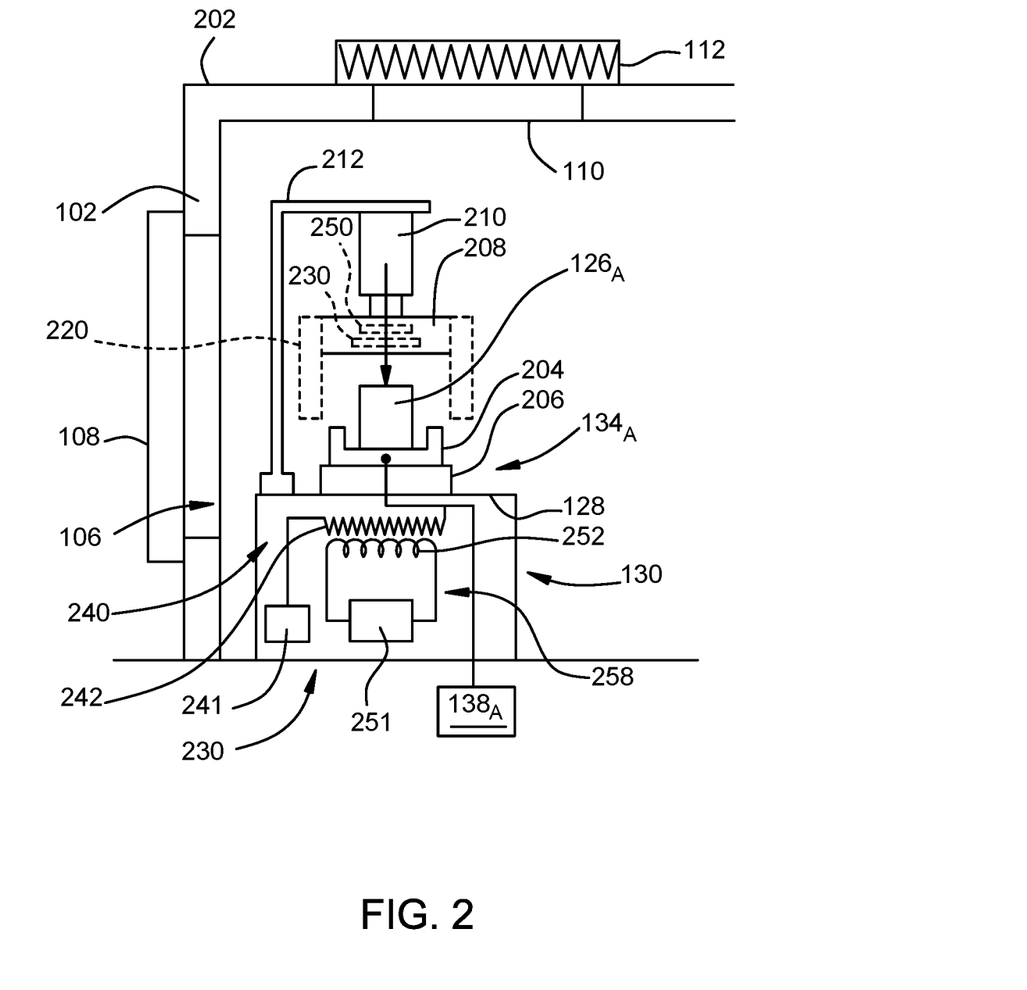
FIG. 2 is a schematic side view of a portion of the chip package assembly testing system of FIG. 1 illustrating an example of a test station.

Referring now to FIG. 2 that illustrates a schematic side view of a portion of the chip package assembly testing system 100 showing the test station 130 illustrated in greater detail. To assist preventing contamination of the chip package assemblies 126 disposed on the test system 130, the enclosure 102 may optionally include an inlet vent 110 for providing filtered air into the interior region 104 of the enclosure 102. The filtered air may be provided by one or more air filters 112 mounted to an exterior of the enclosure 102 or other suitable location.

The support surface 128 of the test station 130 is illustrated such that only the first interface 134$_A$ is illustrated. The first interface 134$_A$ of the test station 130 is configured essentially identical to the second interface 134$_B$, except wherein the second interface 134$_B$ is configured to accept and test a different chip package assembly (e.g., the chip package assembly 126$_B$) while the first interface 134$_A$ is configured to accept and test the chip package assembly 126$_A$.

The first interface 134$_A$ is configured to accept a single chip package assembly 126$_A$ or multiple chip package assemblies 126$_A$. The interface 134$_A$ may be readily removed and replaced on the first test station 130 with another interface configured to interface with a different number of chip package assemblies 126$_A$. Thus, the ability to swap the interface 134$_A$ with other interfaces allows the test station 130 to be readily adapted to meet production needs with minimal cost and down time. The interface 134$_B$ is similarly configured.

The first interface 134$_A$ of the test station 130 includes a PCB board 206 and at least one chip socket 204. The chip socket 204 is configured to mate with a predefined configuration of a solder bump array disposed on the bottom of the chip package assembly 126$_A$. The first interface 134$_A$ may be configured with multiple chip sockets 204 to test multiple chip assemblies 126$_A$. The chip socket 204 being configured for interfacing with a specific solder bump array of a chip package assembly, may be replaced with a differently configured chip socket 204 to allow interfacing with a solder bump array having a different configuration for a different chip package assembly. In one example, the chip socket 204 of the first interface 134$_A$ has a first package receiving area 146$_A$ (i.e., the area that receives and mates with the chip package assembly 126$_A$) is larger than a second package receiving area 146$_B$ of the chip socket 204 of the second interface 134$_B$.

The test system 130 also includes a plunger 208 operable to push the chip package assembly 126$_A$ into sufficient contact with the socket 204 that ensures good transfer of signals between the chip package assembly 126$_A$ and the socket 204 to facilitate testing of the chip package assembly 126$_A$. Each socket 204 may be paired with its own plunger 208. The plunger 208 is coupled to an actuator 210, such as a pneumatic cylinder, ball screw, or other linear actuator, that can control the force exerted by the plunger 208 that pushes the chip package assembly 126$_A$ against the socket 204. In one example, the actuator 210 is operable to urge the plunger 208 downward against the chip package assembly 126 with a force of about 35 grams per solder bump. The actuator 210 and plunger 208 are supported over the support surface 128 by a stanchion or gantry 212.

An optional shroud 220 may be coupled to the plunger 208. The shroud 220 circumscribes the plunger 208 to at least partially shield the chip package assembly 126 and socket 204 when the plunger 208 is urged against the chip package assembly 126. In one embodiment, the shroud 220 may be in contact with the support surface 128 when the plunger 208 is urged against the chip package assembly 126. The shroud 220 functions to isolate and maintain control of the environmental conditions around the chip package assembly 126 during testing.

The test system 130 additionally includes a temperature control unit 230. The temperature control unit 230 functions to control the temperature of the chip package assembly 126 during testing. In one example, the temperature control unit 230 may maintain the temperature of the chip package assembly 126 at a predefined high temperature, for example at about 155 degrees Celsius, during one test routine and at a predefined low temperature, for example at about −40 degrees Celsius, during another test routine.

In one example, the temperature control unit 230 may be disposed below the socket 204, for example on, in, or below the support surface 128. In another example, the temperature control unit 230 may be disposed in or attached to the plunger 208. When in or attached to the plunger 208, use of the optional shroud 220 confines the heat (or cooling) closely around the chip package assembly 126, which advantageously speeds heating (or cooling) and reduces temperature drift during testing.

In one example, the temperature control unit 230 may include a heater 240 and a cooler 250. The heater 240 may be a resistive heater, a radiant heater, an inductive heater or other heat source. In one example, the heater 240 includes a heating element 242 coupled to a heater power source 241. The heating element 242 may be as a resistor or lamp. The heater power source 241 provides power to the heating element 242 for controlling the amount of heat generated by the heating element 242 in response to commands from the first test processor 138$_A$.

The cooler 250 may be a thermoelectric device or conduit for circulating a heat transfer fluid therethrough. In one example, the cooler 250 includes a conduit 252 coupled to a chiller 251. The chiller 251 controls the temperature of a heat transfer fluid circulated through the conduit 252 for controlling the amount of temperature of the chip package assembly 126 in response to commands from the first test processor 138$_A$.

Each interface 134$_A$, 134$_B$ may be paired with a separate temperature control unit 230 to allow the temperature, and thus the test routine, performed in each of the interfaces 134$_A$, 134$_B$ to be different. In one example, one temperature control unit 230 is configured to selectively maintain the first test interface 134$_A$ at a first temperature during a first test routine and at a second temperature that is different than the first temperature during a second test routine, thus allowing both high and low temperate tests to be performed from a single test interface. In another example, one temperature control unit 230 is configured to selectively maintain the first test interface 134$_A$ at a first temperature during a first test routine while another temperature control unit 230 is configured to selectively maintain the second test interface 134$_B$ of the same test station 130 at a second temperature during a second test routine is at a second temperature that is different than the first temperature during a second test routine, thus allowing both high and low temperate tests to be performed simultaneously on different chip package assemblies 126$_A$, 126$_B$ at a single test station 130.

As discussed above with reference to FIG. 1, the first interface 134$_A$ of the test station 130 is coupled to the first test processor 138$_A$. The first test processor 138$_A$ generally executes test routine (e.g., predetermined test routine) that is stored or accessible by the first test processor 138$_A$. The test routine may be inputted into the first test processor 138$_A$ through a user interface, or uploaded or accessed from the controller 170 and/or host processing system 180. The first test processor 138 executes the test routine in a manner that runs a predefined test on the one or more chip package assemblies 126$_A$ coupled to the first interface 134$_A$ of the first test station 130. The test routine may be one or more of a DC test routine, a burn-in routine, post burn-in routine, a final test routine or other predefined test routine to be performed on the chip package assembly $126_A$.

In one example, a DC test routine is performed on chip package assembly $126_A$ disposed in the first interface $134_A$ of the first test station 130. The DC test routine may include subjecting the chip package assembly $126_A$ to a high DC load for a period to time, and testing the chip package assembly $126_A$ for electrical shorting, resistance, temperature rise, RC delay, speed, other performance characteristic or malfunction or other defect. The DC test routine may include adding test information, such as pass, fail or other performance information, to the information stored on the controller 170 and uniquely associated with the tested chip package assembly $126_A$. The results of the DC test routine may also be utilized by the controller 170 to direct the transfer of the tested chip package assembly $126_A$ to a particular carrier or region of a carrier based on the test results. For example, all chip package assemblies $126_A$ passing the DC test routine may be transferred to adjoining regions of a selected carrier such that all passing chip package assemblies $126_A$ are grouped together on the carrier separated from all chip package assemblies $126_A$ that have failed the DC test routine. In another example, all chip package assemblies $126_A$ passing the DC test routine may be transferred to one carrier, for example, a first one of a second carrier $120_A$ disposed in the output queuing station $116_A$, while all chip package assemblies $126_A$ failing the DC test routine may be transferred to a different carrier, for example, the second one of the second carrier $120_A$ disposed in the output queuing station $116_A$.

In another example, a burn-in test routine is performed on chip package assembly $126_A$ disposed in the first interface $134_A$ of the first test station 130. The burn-in test routine may include subjecting the chip package assembly $126_A$ to a high-stress environment, such as high voltage, high amperage, high temperature and/or high frequency electric signals. The burn-in test routine may include subjecting the chip package assembly $126_A$ to a high-stress environment for a period to time, and testing the chip package assembly $126_A$ for a short, resistance, temperature rise, RC delay, speed, other performance characteristic or malfunction or other defect. The burn-in test routine may include adding test information, such as pass, fail or other information, to the information stored on the controller 170 and uniquely associated with the tested chip package assembly $126_A$. The results of the burn-in test routine may also be utilized by the controller 170 to direct the transfer of the tested chip package assembly $126_A$ to a particular carrier or region of the carrier based on the test results, such as discussed above.

In yet another example, a post burn-in test routine is performed on chip package assembly $126_A$ disposed in the first test station 130. The post burn-in test routine may include testing the electrical characteristics and function of the chip package assembly $126_A$ at room temperature and below room temperature. The post burn-in test routine may include subjecting the chip package assembly $126_A$ to a room temperature environment for a period to time, and testing the electrical characteristics and function of the chip package assembly $126_A$. The post burn-in test routine may also include subjecting the chip package assembly $126_A$ to a sub-room temperature environment for a period to time, and testing the electrical characteristics and function of the chip package assembly $126_A$. The post burn-in test routine may include adding test information, such as performance, functionality, pass, fail or other performance information, to the information stored on the controller 170 and uniquely associated with the tested chip package assembly $126_A$. Other performance may include, but is not limited to, one or more of resistance, temperature rise, RC delay, speed, malfunction or other defect The results of the post burn-in test routine may also be utilized by the controller 170 to direct the transfer of the tested chip package assembly $126_A$ to a particular carrier or region of the carrier based on the test results, such as discussed above.

In still yet another example, a final test routine is performed on chip package assembly $126_A$ disposed in the first test station $130_A$. The final test routine may include testing the electrical characteristics and function of the chip package assembly $126_A$ at a temperature elevated above room temperature (e.g., elevated temperature such as at about 155 degrees Celsius) and/or at a temperature below room temperature (e.g., cold temperature such as at about −55 degrees Celsius). The final test routine may include subjecting the chip package assembly $126_A$ to an elevated (and/or cold) temperature environment for a period to time, and testing the electrical characteristics and function of the chip package assembly $126_A$. The final test routine may include adding test information, such as performance, functionality, pass, fail or other performance information, to the information stored on the controller 170 and uniquely associated with the tested chip package assembly $126_A$. The results of the final test routine may also be utilized by the controller 170 to direct the transfer of the tested chip package assembly $126_A$ to a particular carrier or region of the carrier based on the test results, such as discussed above.

In yet another example, the final test routine performed on chip package assembly $126_A$ may mimic operating conditions of the device in which the chip package assembly $126_A$ will be interfaced with. The operating conditions of the final test routine may include temperature variation and voltage fluxations.

It is contemplated that other test routines may be performed in the first test station 130 or other test station within the testing system 100.

Similarly, the second interface $134_B$ of the test station 130 is coupled to the second test processor $138_B$. The second test processor $138_B$ generally executes test routine (e.g., predetermined test routine) that is stored or accessible by the second test processor $138_B$ that is different than the test return executed by the first test processor $138_A$. The test routine may be inputted into the second test processor $138_B$ as described above. The second test processor $138_B$ executes the test routine in a manner that runs a predefined test on the one or more chip package assemblies $126_B$ coupled to the second interface $134_B$ of the first test station 130. The test routine may be one or more of a DC test routine, a burn-in routine, post burn-in routine, a final test routine or other predefined test routine to be performed on the chip package assembly $126_B$. Examples of such test routines are discussed above with reference to the test routines executed by the second test processor $138_B$.

Referring back to FIG. 1 and as discussed above, the robot 150 is disposed in the interior region 104 and has a range of motion operable to transfer a chip package assembly 126 between any of the queuing stations 114, 116 and the test stations 130, 132. In one example, the robot 150 includes a robot base 152, a robot linkage 154, a robot wrist 156, and at least one robot end effector 158. The robot base 152 may be centrally located within the enclosure 102, and in one embodiment, is surrounded by the queuing and test stations 114, 116, 130, 132. The robot linkage 154 is coupled at a proximal end to the robot base 152. Motors within the robot base 152 are operable to rotate the robot linkage 154 up to 360 degrees around the robot base 152.

The robot wrist 156 is coupled to a distal end of the robot linkage 154. The at least one robot end effector 158 is coupled to robot wrist 156.

The robot end effector 158 is generally configured to facilitate picking and placing of the chip package assemblies 126 by the robot 150 between the various stations of the testing system 100. In the example illustrated in FIG. 1, the robot 150 includes at least two robot end effectors 158, wherein each end effector is suitable for picking and placing a different type of chip package assembly 126.

The robot linkage 154 is configured to extend and retract the robot end effector 158 and the robot wrist 156 radially relative to the robot base 152. The robot linkage 154 may also be configured to control the elevation of the robot end effector 158 within the enclosure 102. Alternatively, the robot base 152 may include actuators configured to control the elevation of the robot linkage 154 and robot end effector 158 coupled thereto.

The robot wrist 156 also allows the robot end effector 158 to be rotated relative to the robot linkage 154. The rotation of the robot wrist 156 and motion of the robot linkage 154 allows the robot end effector 158 to be orientated in a manner, for example in an orientation normal to the support surface 128 of the carriers, that allows a selected one of the chip package assemblies 126 to be picked up from or placed on any one of the queuing and test stations 114, 116, 130, 132.

The robot end effector 158 is generally configured to selectively secure the chip package assembly 126 to the robot 150 during transfer between the carriers 118, 120 disposed on the queuing stations 114, 116 and the test stations 130, 132. In other words, the robot end effector 158 enables the picking and placing of the chip package assemblies 126 between any one of the queuing stations 114, 116 and the test stations 130, 132 by the robot end effector 158.

Also as illustrated in the embodiment depicted in FIG. 1, the AIDC device 160 may be coupled to the robot 150 in a location suitable to read the identification tags 144 affixed to the carriers 118, 120 disposed on the input and output queuing stations 114, 116. For example the AIDC device 160 may be coupled to one of the distal end of the robot linkage 154, the robot wrist 156 or robot end effector 158 such that the AIDC device 160 may be readily positioned by the robot 150 in a location over or proximate to the queuing stations 114, 116 where the tags 144 may be reliably read by the AIDC device 160. Alternatively, one or more AIDC devices 160 may be located within the enclosure 102 to enable identification of the particular carriers 118, 120 disposed in the queuing stations 114, 116.

Figure 3:
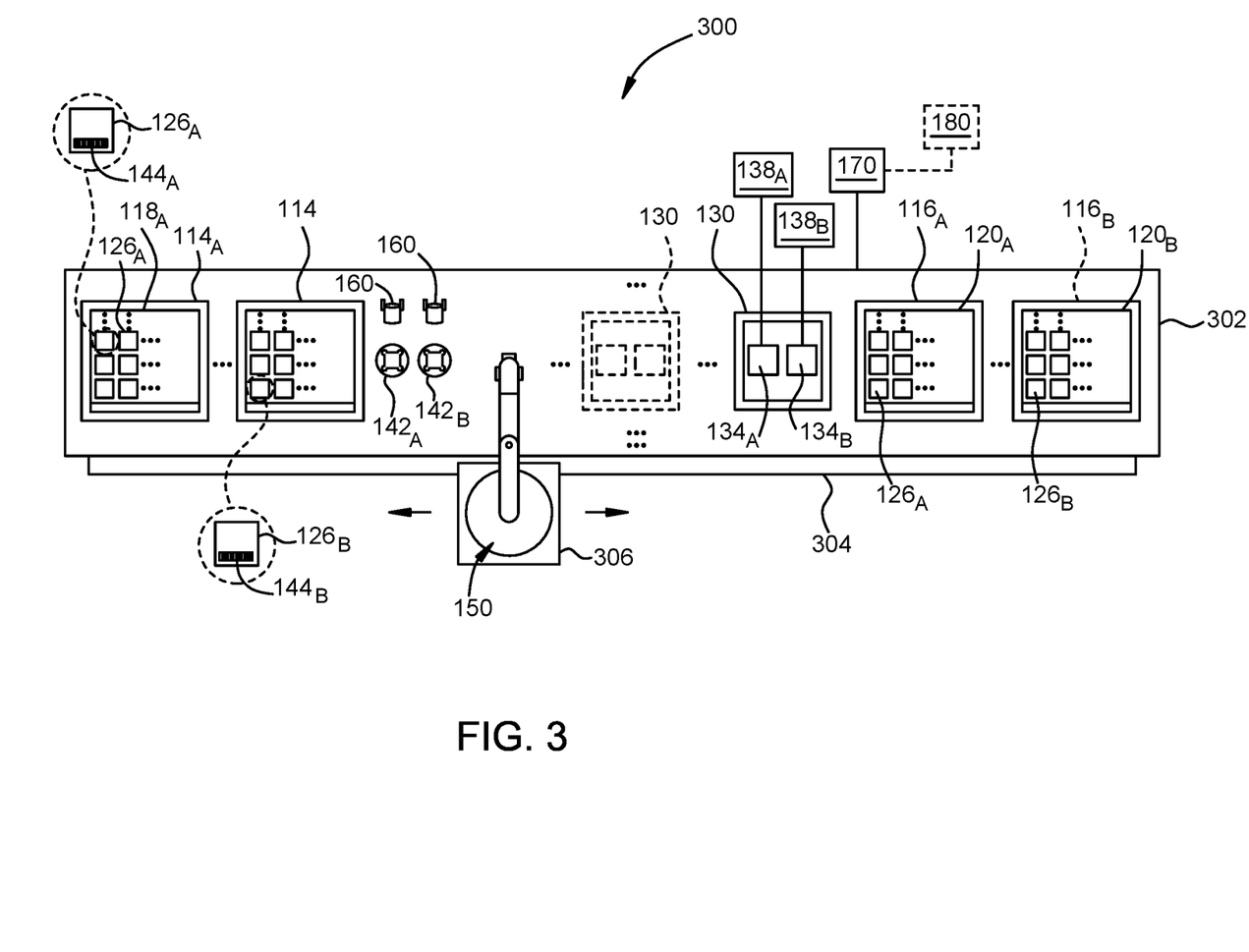
FIG. 3 is a schematic top view of another chip package assembly testing system.

FIG. 3 is a schematic top view of another chip package assembly testing system 300. The chip package assembly testing system 300 is generally similar to the chip package assembly testing system 100 described above, except wherein the stations 114, 116, 130 are arranged along a rail 304 on which the robot 150 travels as opposed to being radially arranged around the robot 150. A second test station 130 is shown in dashed lines in FIG. 3 to indicate that one or more test stations may be utilized. Additionally, it is contemplated that more than two input queuing stations 114 and/or two output queuing stations 116 may be utilized.

The testing system 300 generally includes a base 302 on which the stations 114, 116, 130 are disposed. In one embodiment, at least three of the stations 114, 116, 130 are generally aligned in a linear arrangement. Two precisors 142 are arranged between at least two of the stations 114, 116, 130, 132. In one example, the precisors $142_A$, $142_B$ are located between the queuing stations 114 and the test station 130.

The robot 150 is arranged to move laterally within the testing system 300. For example, the robot 150 may be linearly between the stations 114, 116, 130 and the precisors $142_A$, $142_B$. In the example depicted in FIG. 3, the robot 150 is mounted to a guide 306 that travels along a rail 304 that is affixed to the base 302. Alternatively, the guide 306 may be suspended or affixed to a ceiling or enclosure 102 (not shown in FIG. 3). It is contemplated that more than one robot 150 may be utilized to increase the efficiency of transfer between the stations 114, 116, 130. Although not shown, two or more additional robots 150 may be utilized. For example, one or more robots 150 may be moveably attached to the rail 304 to move chip package assemblies 126 between the input queuing stations 114, the precisors $142_A$, $142_B$ and test station(s) 130, while one or more additional robots 150 may be moveably attached to the rail 304 to move chip package assemblies 126 between test station(s) 130, 132 and output queuing stations 116.

The linear arrangement of the testing system 300 allows more queuing or test stations to be utilized with minimal impact to floor space requirements. Moreover, the linear arrangement of the testing system 300 enables the robot 150 to perform faster transfers.

Figure 4A:
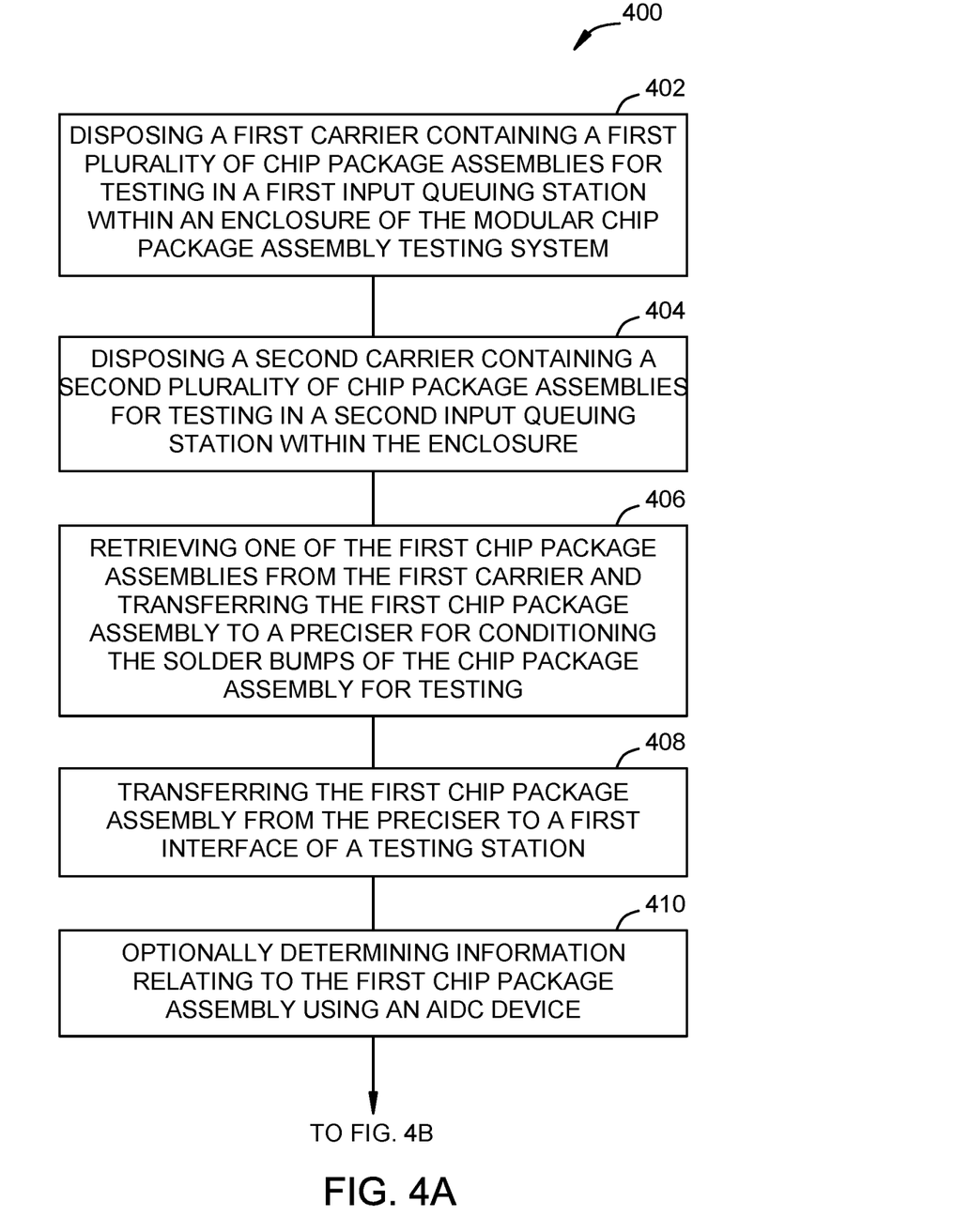
FIGS. 4A-B are a flow diagram of a method for simultaneously testing different chip package assemblies in a chip package assembly testing system.
Figure 4B:
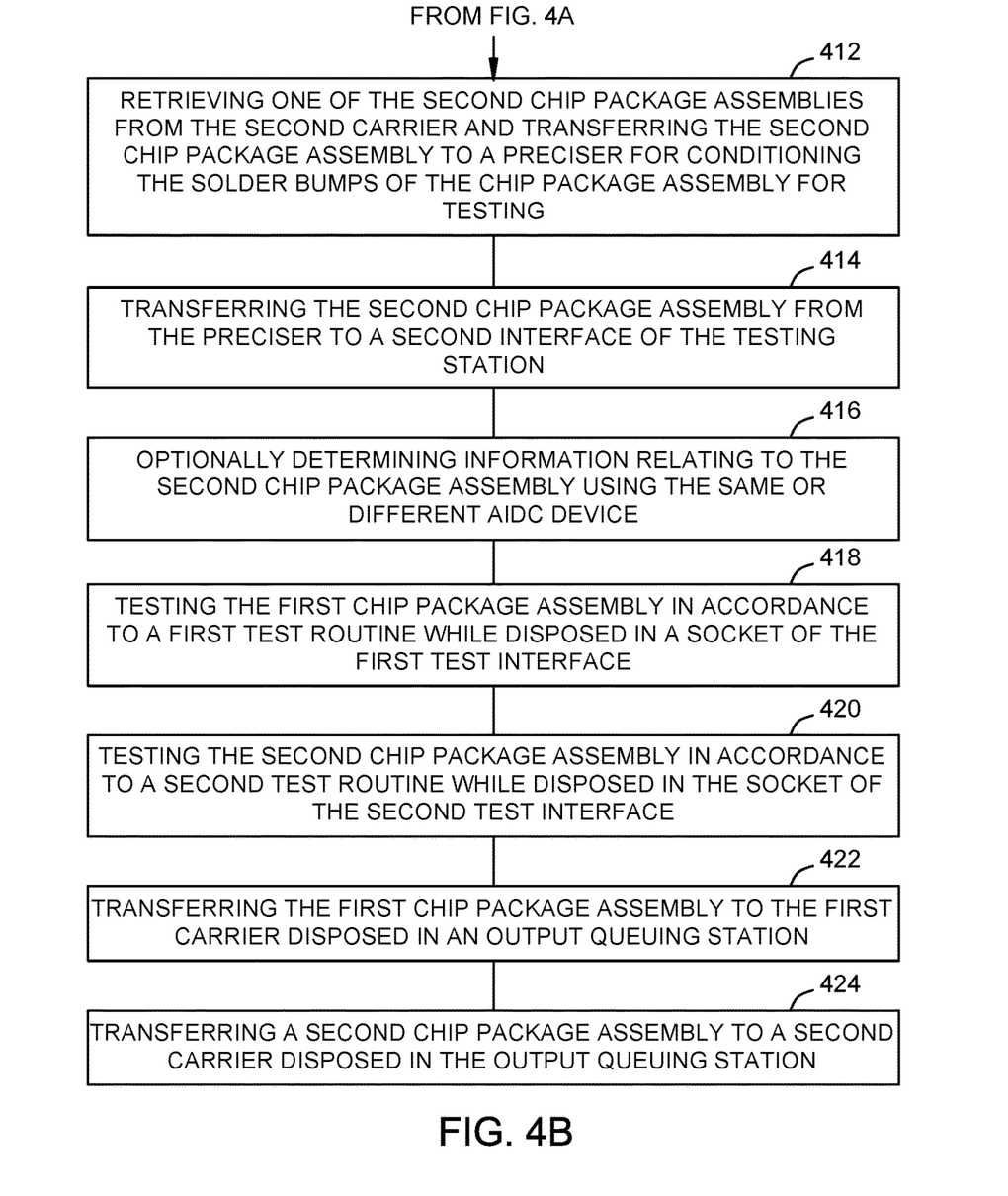

FIGS. 4A-B are a flow diagram of another method 400 for testing a chip package assembly 126 in a chip package assembly testing system, such as, for example, the chip package assembly testing systems 100, 300 described above among others. The method 400 begins at operation 402 by disposing a first carrier $118_A$ containing a first plurality of chip package assemblies $126_A$ for testing a first input queuing station $114_A$ within an enclosure 102 of the modular chip package assembly testing system 100, 300. At operation 404, a second carrier $118_B$ containing a second plurality of chip package assemblies $126_B$ for testing are disposed in a second input queuing station $114_B$ within the enclosure 102 of the modular chip package assembly testing system 100, 300. The chip package assemblies $126_A$ and the chip package assemblies $126_B$ are of a different type.

At operation 406, one of the chip package assembly $126_A$ retrieved from the first carrier $118_A$ and transferred to a preciser $142_A$ for conditioning the solder bumps of the chip package assembly $126_A$ for testing. After the preciser $142_A$ conditions the solder bumps of the chip package assembly $126_A$, the chip package assembly $126_A$ is transferred to a first interface $134_A$ of the test station 130 at operation 408.

Optionally at operation 410, information relating to the chip package assembly $126_A$ may be determined using an AIDC device 160 that reads a machine readable information tag $144_A$ associated with chip package assembly $126_A$. The unique identification of the information tag 144 read by the AIDC device 160 is provided to a controller 170 that stores or has access to information regarding the chip package assembly $126_A$, such as but not limited to the type of chip package assembly $126_A$.

At operation 412, one of the chip package assembly $126_B$ retrieved from the second carrier $118_B$ and transferred to a preciser $142_B$ for conditioning the solder bumps of the chip package assembly $126_B$ for testing. After the preciser $142_B$ conditions the solder bumps of the chip package assembly $126_B$, the chip package assembly $126_B$ is transferred to a first interface $134_B$ of the test station 130 at operation 414. Optionally at operation 416, information relating to the chip package assembly $126_B$ may be determined using the same or different AIDC device 160 as described above.

At operation 418, the first chip package assembly 126$_A$ is tested in accordance with a first test routine while disposed in the socket 204 of the first test interface 134$_A$. At operation 420, the second chip package assembly 126$_B$ is tested in accordance with a second test routine while disposed in the socket 204 of the second test interface 134$_B$. The first and second test routines are different because the types of the chip package assemblies are different. The first and second test routines are performed independently, and thus, the first and second test routines may be performed simultaneously at least over a portion of each test routine. The first and second test routines may be any of the test routines described above, among others.

Upon completion of testing, the first chip package assembly 126$_A$ is transferred to the first carrier 118$_A$ disposed in the output queuing station 116$_A$ at operation 422. The first chip package assembly 126$_A$ may be sorted within the first carrier 118$_A$ based on the test results of the first chip package assembly 126$_A$. For example, the robot 150 may transfer the chip package assembly 126$_A$ having passing test result to one region of the first carrier 118$_A$ while transferring chip package assembly 126$_A$ having failing test result to a different region of the first carrier 118$_A$, thus sorting passing and failing chip package assemblies 126.

Alternatively, the first chip package assembly 126$_A$ may be sorted between multiple carriers 118$_A$ based on the test results of the first chip package assembly 126$_A$. For example, the robot 150 may transfer the chip package assembly 126$_A$ having passing test result to a first carrier 118$_A$ while transferring chip package assembly 126$_A$ having failing test result to a second carrier 118$_A$, thus sorting passing and failing chip package assemblies 126 in the output queuing station 116$_A$.

Similarly, upon completion of testing, the second chip package assembly 126$_B$ is transferred to the second carrier 118$_B$ disposed in the output queuing station 116$_B$ at operation 424. The second chip package assembly 126$_B$ may be sorted within the second carrier 118$_B$ based on the test results of the second chip package assembly 126$_B$. For example, the robot 150 may transfer the chip package assembly 126$_B$ having passing test result to one region of the second carrier 118$_B$ while transferring chip package assembly 126$_B$ having failing test result to a different region of the second carrier 118$_B$, thus sorting passing and failing chip package assemblies 126.

Alternatively, the second chip package assembly 126$_B$ may be sorted between multiple carriers 118$_B$ based on the test results of the second chip package assembly 126$_B$. For example, the robot 150 may transfer the chip package assembly 126$_B$ having passing test result to a second carrier 118$_B$ while transferring chip package assembly 126$_B$ having failing test result to a second carrier 118$_B$, thus sorting passing and failing chip package assemblies 126 in the output queuing station 116$_B$.

The method 400 may also include communicating the test results of the first chip package assembly 126$_A$ and the first chip package assembly 126$_B$ to a host processing system 180 disposed remote from the chip package assembly testing system 100, 300.

Thus, a chip package assembly test system has been provided which improves testing throughput without increasing space requirements as compared to conventional test systems. The chip package assembly testing system may be configured to simultaneously test different types of testing chip package assemblies. The chip package assembly testing system may also be configured to sort tested chip package assemblies for more efficient handling. Advantageously, the modularly of the chip package assembly testing system that allows additional queuing or test stations provides additional flexibility to meet changing production demands with limited additional capital expenditures or down time for system reconfiguration. Moreover, the chip package assembly testing system may be configured with stations surrounding and served by a single robot in applications where a small tool footprint is required, or configured in a linear arrangement that enables a greater number of stations to be utilized for faster throughput equating to a reduced unit cost per chip package assembly.

Some embodiments are described in the claims below, while others are non-exhaustively provided in the following examples.

In a first example, a method for testing a chip package assembly is described that includes, transferring a first chip package assembly for testing in first test interface of a test station of a chip package assembly testing system, testing the first chip package assembly using a first predefined test routine at a first predefined temperature, transferring a second chip package assembly for testing in second test interface of the test station of the chip package assembly testing system, wherein the first and second chip package assemblies are different types, and, testing the second chip package assembly using a second predefined test routine, wherein testing the first and second chip package assemblies occur simultaneously.

In a second example, the first example may further be defined as, wherein the transferring the first chip package assembly includes disposing the first chip package assembly on a first socket having a first package receiving area; and wherein the transferring the second chip package assembly includes disposing the second chip package assembly on a second socket having a first package receiving area, wherein the first package receiving area is larger than the second package receiving area.

In a third example, the first example may further include obtaining information relating to a third chip package assembly using an automatic identification and data capture (AIDC), and transferring the third chip package assembly to one of the first or second test interfaces in response to the information obtained by the AIDC device pertaining to the third chip package assembly.

In a fourth example, the first example may further include retaining the first chip package assembly by a first end effector of a robot while the second chip package assembly is retained by a second effector of the robot.

In a fifth example, the first example may further include heating the first chip package assembly, and cooling the second chip package assembly.

In a sixth example, the first example may further be defined by wherein the testing the second chip package assembly include testing the first chip package assembly with a test routine different than a test routine utilized to test the second chip package assembly.

In a seventh example, the first example may further be defined as wherein the first chip package assembly is larger than the second chip package assembly.

In an eighth example, the first example may further be defined as wherein testing the second chip package assembly using the second predefined test routine includes testing the second chip package assembly at a temperature different than a temperature at which the first chip package assembly first is tested using the first predefined test routine.

In a ninth example, a method for testing a chip package assembly is described that includes, transferring a first chip package assembly for testing in first test interface of a test station of a chip package assembly testing system, testing the first chip package assembly using a first predefined test routine at a first predefined temperature, transferring a second chip package assembly for testing in second test interface of the test station of the chip package assembly testing system, and, testing the second chip package assembly using a second predefined test routine at a second predefined temperature that is different than the first predefined temperature, wherein testing the first and second chip package assemblies occur simultaneously.

In a tenth example, the ninth example may further be defined by wherein testing the first chip package assembly includes heating the first chip package assembly and wherein testing the second chip package assembly comprises cooling the second chip package assembly.

In an eleventh example, the ninth example may further be defined by wherein the first predefined test routine is different than the second predefined test.

In a thirteenth example, the ninth example may further be defined by wherein the first predefined temperature is different than the second predefined temperature.

In a fourteen example, the ninth example may further be defined by wherein the transferring the first chip package assembly includes disposing the first chip package assembly on a first socket having a first package receiving area; and wherein the transferring the second chip package assembly includes disposing the second chip package assembly on a second socket having a first package receiving area, wherein the first package receiving area is larger than the second package receiving area.

In a fifteen example, the ninth example may further include obtaining information relating to a third chip package assembly using an automatic identification and data capture (AIDC), and transferring the third chip package assembly to one of the first or second test interfaces in response to the information obtained by the AIDC device pertaining to the third chip package assembly.

In a sixteenth example, the ninth example may further include retaining the first chip package assembly by a first end effector of a robot while the second chip package assembly is retained by a second effector of the robot.

In a seventeenth example, the ninth example may further include heating the first chip package assembly, and cooling the second chip package assembly.

In an eighteenth example, the ninth example may further be defined by wherein the testing the second chip package assembly includes testing the first chip package assembly with a test routine different than a test routine utilized to test the second chip package assembly.

In a nineteenth example, the ninth example may further be defined by wherein the first chip package assembly is larger than the second chip package assembly.

In a twentieth example, the ninth example may further be defined by wherein testing the second chip package assembly using the second predefined test routine includes testing the second chip package assembly at a temperature different than a temperature at which the first chip package assembly first is tested using the first predefined test routine.

While the foregoing is directed to embodiments of the present invention, other and further embodiments of the invention may be devised without departing from the basic scope thereof, and the scope thereof is determined by the claims that follow.

What is claimed is:

1. An IC test system comprising:
   (A) an input queuing station configured to receive a first chip package assembly and a second chip package assembly for testing within the IC test system;
   (B) an output queuing station configured to receive the chip package assemblies after testing within the IC test system;
   (C) a first test station comprising a first test interface and a second test interface, the first test interface configurable to receive and communicatively connect with the first chip package assembly having one arrangement of solder ball connections, a first test processor configured to test the first chip package assembly connected through the first test interface utilizing a predetermined first test routine, the second test interface configurable to receive and communicatively connect with the second chip package assembly having a different arrangement of solder ball connections relative to the first chip package assembly, and a second test processor configured to test the second chip package assembly connected through the second test interface utilizing a predetermined second test routine simultaneously with the first chip package being tested in the first test interface; and
   (D) a robot having a range of motion operable to transfer a chip package assembly between any of the input queuing station, the output queuing station, the first test interface and the second test interface.

2. The IC test system of claim 1 further comprising:
   a temperature control unit having a heater and a cooler, the temperature control unit configured to selectively maintain the first test interface at a first temperature during the predetermined first test routine and at a second temperature that is different than the first temperature during the predetermined second test routine.

3. The IC test system of claim 2, wherein the heater of the temperature control unit is a resistive heater and the cooler of the temperature control unit is a chiller.

4. The IC test system of claim 1, wherein the first test station comprises:
   a plunger operable to selectively urge a chip package assembly into communicative contact with the first test interface.

5. The IC test system of claim 4 further comprising:
   a temperature control unit having a heater and a cooler, the temperature control unit configured to selectively maintain the first test interface at a first temperature during the predetermined first test routine and at a second temperature that is different than the first temperature during the predetermined second test routine, wherein the heater and cooler are coupled to the plunger.

6. The IC test system of claim 1, wherein the first test interface comprises:
   a replaceable socket adapted to communicatively coupled with a chip package assembly having a predefined arrangement of solder ball connections.

7. The IC test system of claim 1, wherein the robot further comprises:
   a first end effector configured to selectively retain a first chip package assembly during transfer; and
   a second end effector configured to selectively retain a second chip package assembly during while the first end effector retains the first chip package assembly.

8. The IC test system of claim 1 further comprising:
an automatic identification and data capture (AIDC) device operable to identify a chip package assembly, the AIDC device disposed within the range of motion of the robot.

9. The IC test system of claim 8 further comprising:
a controller configured to control placement of chip package assemblies by the robot in response information obtained from the AIDC device.

10. An IC test system comprising:
(A) an input queuing station configured to receive a first chip package assembly and a second chip package assembly for testing within the IC test system;
(B) an output queuing station configured to receive the chip package assemblies after testing within the IC test system;
(C) a first test station comprising a first test interface and a second test interface, the first test interface configurable to receive and communicatively connect with the first chip package assembly, a first test processor configured to test the first chip package assembly connected through the first test interface utilizing a predetermined first test routine, the second test interface configurable to receive and communicatively connect with the second chip package assembly, and a second test processor configured to test the second chip package assembly connected through the second test interface utilizing a predetermined second test routine, wherein the first test interface is configured to receive and communicatively connect with a chip package assembly having a different arrangement of solder ball connections relative to a configuration of the second test interface while simultaneously performing the predetermined first test routine and predetermined second test routine;
(D) a temperature control unit having a heater and a cooler, the temperature control unit configured to selectively maintain the first test interface at a first temperature during the predetermined first test routine and at a second temperature that is different than the first temperature during the predetermined second test routine; and
(E) a robot having a range of motion operable to transfer a chip package assembly between any of the input queuing station, the output queuing station, the first test interface and the second test interface.

11. The IC test system of claim 10, wherein the heater of the temperature control unit is a resistive heater and the cooler of the temperature control unit is a chiller.

12. The IC test system of claim 10, wherein the first test station comprises:
a plunger operable to selectively urge a chip package assembly into communicative contact with the first test interface.

13. The IC test system of claim 12, wherein the temperature control unit is coupled to the plunger.

14. The IC test system of claim 10, wherein the robot further comprises:
a first end effector configured to selectively retain a first chip package assembly during transfer; and
a second end effector configured to selectively retain a second chip package assembly during while the first end effector retains the first chip package assembly.

15. The IC test system of claim 10 further comprising:
an automatic identification and data capture (AIDC) device operable to identify a chip package assembly, the AIDC device disposed within the range of motion of the robot.

16. A method for testing a chip package assembly, the method comprising:
transferring a first chip package assembly for testing in a first test interface of a test station of a chip package assembly testing system, the first chip package assembly having a first arrangement of solder ball connections;
testing the first chip package assembly using a first predefined test routine at a first predefined temperature;
transferring a second chip package assembly for testing in second test interface of the test station of the chip package assembly testing system, the second chip package assembly having a second arrangement of solder ball connections, the second arrangement of solder ball connections different relative to that of the first chip package assembly; and
testing the second chip package assembly using a second predefined test routine, wherein testing the first and second chip package assemblies occur simultaneously.

17. The method of claim 16, wherein testing the first chip package assembly comprises heating the first chip package assembly and wherein testing the second chip package assembly comprises cooling the second chip package assembly.

18. The method of claim 16, wherein the first predefined test routine is different than the second predefined test.

19. The method of claim 16, wherein testing the second chip package assembly using the second predefined test routine further comprises:
testing the second chip package assembly using the second predefined test routine at a second predefined temperature, wherein the first predefined temperature is different than the second predefined temperature.

* * * * *